United States Patent [19]

Hosoya et al.

[11] Patent Number: 4,652,778
[45] Date of Patent: Mar. 24, 1987

[54] I²L DELAY CIRCUIT WITH PHASE COMPARATOR AND TEMPERATURE COMPENSATOR FOR MAINTAINING A CONSTANT DELAY TIME

[75] Inventors: Nobukazu Hosoya, Nara; Yoshihiro Murakami, Daito; Takeshi Higashino, Daito; Yoshihiro Harai, Daito, all of Japan

[73] Assignee: Sanyo Electric Co., Ltd., Osaka, Japan

[21] Appl. No.: 543,593

[22] Filed: Oct. 19, 1983

[30] Foreign Application Priority Data

Oct. 20, 1982 [JP] Japan ............................ 57-184910

[51] Int. Cl.⁴ ............................................. H03L 5/00
[52] U.S. Cl. ..................... 307/603; 307/477; 307/603; 307/605; 307/310; 307/591; 358/24; 358/31
[58] Field of Search ............... 307/477, 591, 603, 605, 307/310; 357/92; 358/14, 18, 21 R, 23, 24, 31, 40, 21 V, 36

[56] References Cited

U.S. PATENT DOCUMENTS

| | | | |
|---|---|---|---|
| 4,130,831 | 12/1978 | Isono et al. ............................ | 358/27 |
| 4,393,397 | 7/1983 | Holmes ................................... | 358/36 |
| 4,438,353 | 3/1984 | Sano et al. ............................. | 307/477 |
| 4,489,342 | 12/1984 | Gollinger et al. ..................... | 358/18 X |

FOREIGN PATENT DOCUMENTS

| | | | |
|---|---|---|---|
| 0088464 | 9/1983 | European Pat. Off. .......... | 358/21 R |
| 50-147646 | 11/1975 | Japan . | |
| 0025246 | 2/1980 | Japan ................................... | 358/23 |
| 116343 | 4/1981 | Japan ................................... | 358/31 |
| 0175388 | 10/1983 | Japan ................................... | 358/31 |

OTHER PUBLICATIONS

William K. Hickok, "Amplitude and Phase Sensitive Comb Filter", *Research Disclosure*, Sep. 1978, pp. 56–57.
"VTR" Techniques, Japanese Television Institute Edition, Apr. 20, 1969, p. 27.

*Primary Examiner*—John W. Shepperd
*Attorney, Agent, or Firm*—Armstrong, Nikaido, Marmelstein & Kubovcik

[57] ABSTRACT

A delay circuit for delaying an FM video signal is disclosed. The delay circuit includes an input for supplying the FM video signal, an output for producing a delayed FM video signal, and a delay line connected between the input and output for delaying FM video signal. The delay line is defined by a plurality of I²Ls connected in cascade. The delay circuit further includes a phase comparator provided for comparing a phase between FM video signal at the input and the delayed FM video signal at the output and for producing a difference signal representing the phase difference. The difference signal is used for changing and injection current to be applied to the I²Ls such that the delay effected in the delay line is made substantially equal to the required delay.

8 Claims, 15 Drawing Figures

Fig. 12 (a)
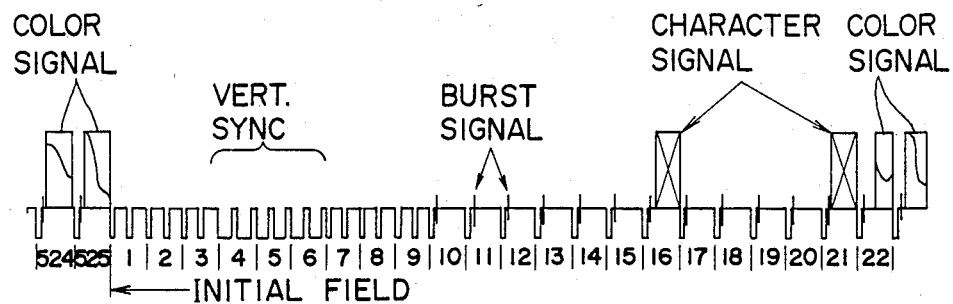
Fig. 12 (b)
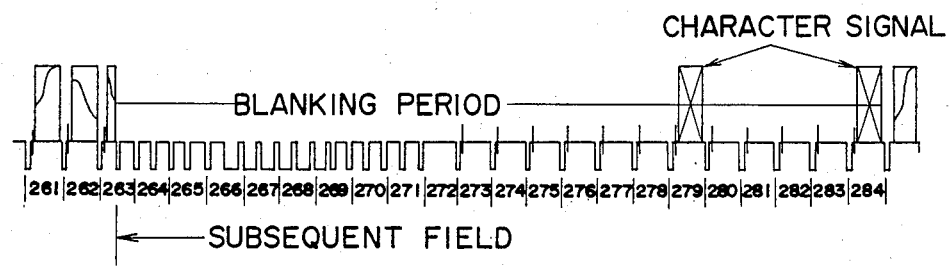
Fig. 12(c)
Fig. 12(d)
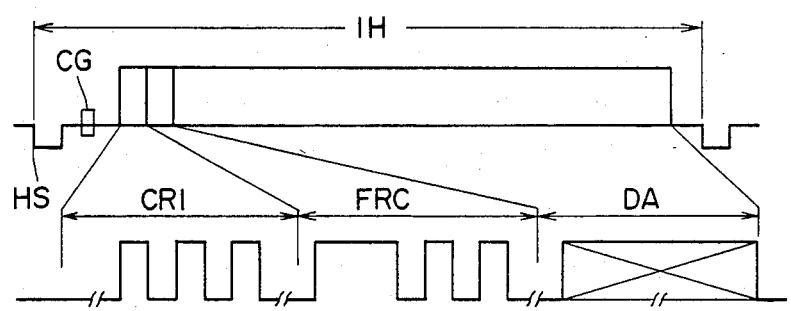

I²L DELAY CIRCUIT WITH PHASE COMPARATOR AND TEMPERATURE COMPENSATOR FOR MAINTAINING A CONSTANT DELAY TIME

BACKGROUND OF THE INVENTION

1. Field of the Invention

The present invention relates to a delay circuit for delaying a combination signal defined by a code signal having a predetermined pattern followed by an information signal carrying a required data with the code signal and information signal being repeated periodically.

2. Description of the Prior Art

An example of the combination signal as defined above is a video signal which comprises a burst signal as the code signal and color signal as the information signal, with the burst signal and color signal fitted in 1H period (about 64 microseconds) and repeated again and again.

In the field of television, it is often necessary to delay the video signal by 1H, and for this purpose, a delay circuit defined by an ultrasonic delay line employing a comb filter having a piezoelectric element deposited on a glass plate or defined by a CCD (charge coupled device) is known.

When the ultrasonic delay line is employed for the delay circuit, there are disadvantages such that the delayed signal loses its power greatly, that the cost of the ultrasonic delay line itself is very high, and that the size of the ultrasonic delay line itself is very large when compared with other electronic elements arranged in an IC (integrated circuit) chip, resulting in high space factor.

On the other hand, when the CCD is employed for the delay circuit, there are disadvantages such that the CCD requires a high grade clock pulse generator for generating drive clock pulses having less deviation, resulting in high manufacturing cost, that the CCD consumes a great amount of power when compared with other electronic elements, that the CCD has an undesirable high radiation, and that it requires many external applications.

SUMMARY OF THE INVENTION

The present invention has been developed with a view to substantially solving the above described disadvantages and has for its essential object to provide a highly accurate delay circuit which is capable of being formed in an IC chip.

It is also an essential object of the present invention to provide a delay circuit of the above described type which operates with a high degree of accuracy regardless of temperature change.

It is a further object of the present invention to provide a delay circuit of the above described type which is simple in construction and can readily be manufactured at low cost.

In accomplishing these and other objects, a delay circuit according to the present invention comprises a plurality of I²Ls (integrated injection logics) connected in cascade between input and output terminals. The combination signal, or video signal, in quantized form using logic "1" and "0" is applied to the input terminal and is delayed for certain degrees of phase each time it passes through one I²L determined by an injection current applied to said one I²L. Thus, when the combination signal is produced from the output terminal, it is delayed for required degrees of phase, such as 1H in the case of video signal.

A delay circuit according to the present invention further comprises a control circuit which detects a phase difference between the combination signal at the input terminal and that at the output terminal and produces a control signal determined by the detected phase difference for controlling the injection current. The injection current is applied to each I²L or some I²Ls for controlling the total delay of the combination signal through the I²Ls.

According to a preferred embodiment of the present invention, the delay circuit further comprises a correction circuit for correcting the delay change in each I²L caused by the temperature change such that the correction circuit controls the injection current to counterbalance the delay change.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIGS. 12(a), 12(b), 12(c) and 12(d) are waveforms of a video signal showing multiplex communication system for characters.

DESCRIPTION OF THE PREFERRED EMBODIMENTS

Figure 1:
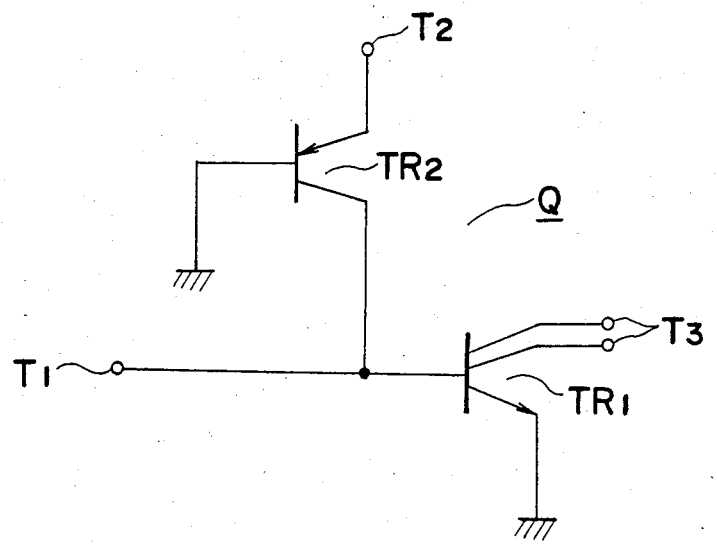
FIG. 1 is an equivalent circuit of I²L to be employed in the delay circuit of the present invention.

Referring to FIG. 1, an I²L (integrated injection logic) Q to be employed in a delay circuit of the present invention is shown. The I²L includes a multi-collector transistor TR1 and a base grounded transistor TR2 for providing a base current to the transistor TR1. A reference number T1 designates an input terminal, T2 designates a terminal for receiving an injection current and T3 designates output terminals.

When the input terminal T1 receives a HIGH signal the transistor TR1 turns on giving LOW output from the terminals T3. Conversely when it receives a LOW signal the current is steered away from the base of the multi-collector transistor TR1. This turns the transistor TR1 off and the output will rise to HIGH determined by the load resistor or pull-up resistor used in the design. The injection current applied to the terminal T2 flows through the base-emitter of the transistor TR1 when the transistor TR1 is on, but flows to the input terminal T1 when the transistor TR1 is off.

Figure 2:
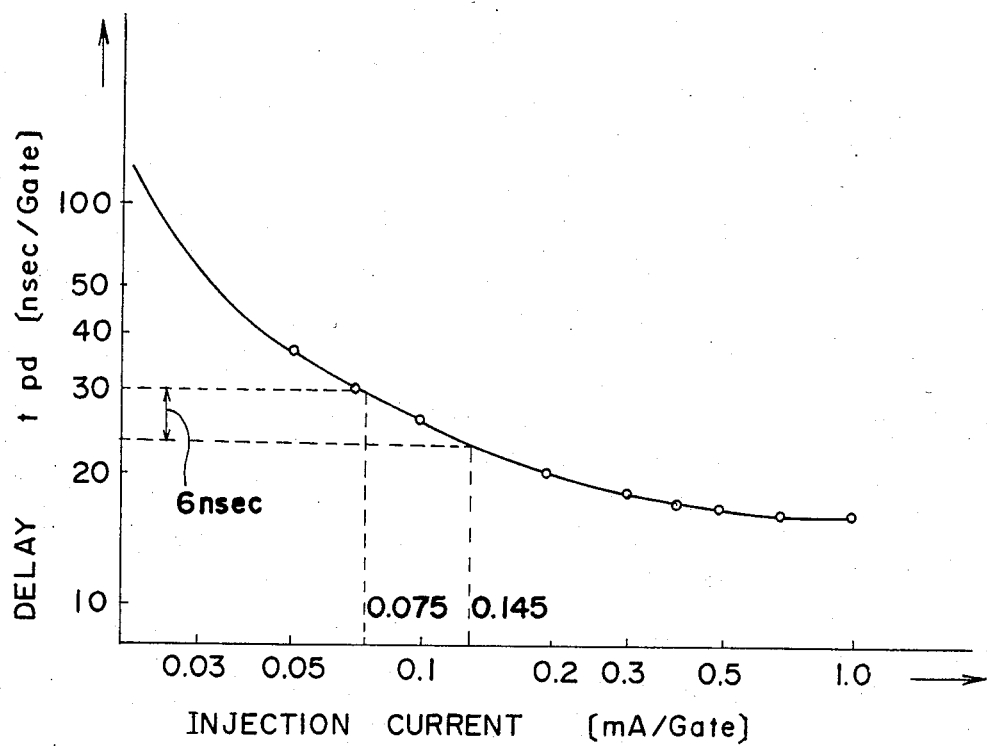
FIG. 2 is a graph showing a delay characteristic of an I²L in which abscissa and ordinate represent injection current and delay time, respectively.

As known to those skilled in the art, there is a time delay between the input signal applied to the input terminal T1 and the output signal produced from the output terminal T3, and such a delay is dependent on the injection current applied to the terminal T2, as shown in graph of FIG. 2, wherein abscissa and ordinate represent injection current and delay, respectively.

As apparent from the graph of FIG. 2, the time delay can be controlled between several tens to several hundreds of nanoseconds. According to the prior art, such a delay is considered to be a drawback, but in the present invention, this characteristic is evaluated as an important factor for defining a delay circuit.

Figure 3:
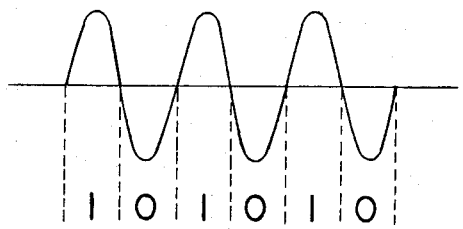
FIG. 3 is a waveform of an exemplified signal to be delayed by the delay circuit and showing a manner of quantization.

As understood from the foregoing, the signal that can be delayed is the one quantized with HIGH and LOW signals. In view of this, a signal having HIGH (1) and LOW (0) levels, such as shown in FIG. 3, can be delayed. It is to be noted that the delayed signal may not have rounded peaks as shown, but will have more flat peaks. Thus, the I$^2$L is applicable to delay two level quantized signals, such as FM signals, pulse modulated signals, digital signals, etc.

Figure 4:
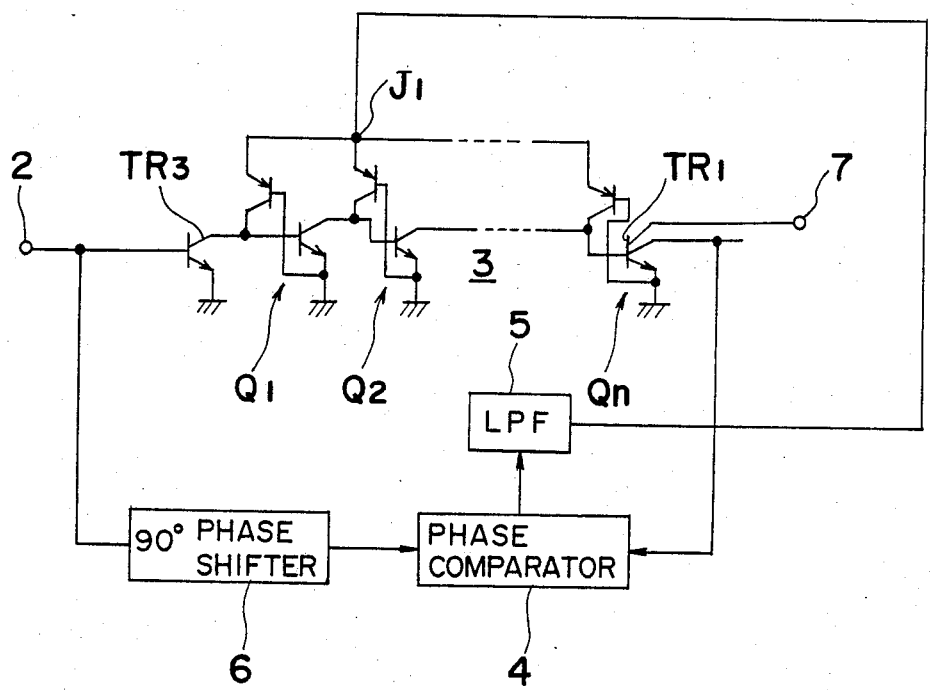
FIG. 4 is a circuit diagram of a delay circuit according to a first embodiment of the present invention.

Referring to FIG. 4, a delay circuit according to the first embodiment of the present invention is shown, which comprises a delay line 3 defined by an emitter grounded transistor TR3 and a plurality of I$^2$Ls Q1, Q2, . . . and Qn connected in cascade between input 2 and output 7. More specifically, the input 2 is connected to the base of the transistor TR3, the collector of the transistor TR3 is connected to the input of the I$^2$L Q1, the output of the I$^2$L Q1 is connected to the input of the I$^2$L Q2, and so on, and the output of the last I$^2$L Qn is connected to the output 7. The terminal for receiving the injection current to each I$^2$L is connected to a common junction J1.

According to one exemplification, each I$^2$L is designed to provide a delay of 100 nanoseconds (=0.1 microseconds) and, therefore, if it is required to provide a total delay of 64 microseconds, which is equal to 1H, it is necessary to provide 640 I$^2$Ls connected in cascade. It is needless to say that such a great many I$^2$Ls can be formed in a very small IC chip.

Although, when the quantized signal, such as an FM signal, passes through the delay line 3, it is expected to have a total delay of a preselected time, such as 64 microseconds, such a total delay may be undesirably changed due to various factors and most of all the temperature change. For example, the delay change with respect to the temperature change from $-20°$ C. to 70° when the injection current is 0.1 mA is shown by a dotted line and 0.01 mA by a solid line in the graph of FIG. 5. In order to correct such a delay change, the delay circuit according to the first embodiment of the present invention further has a control circuit, which is described in detail below.

Referring again to FIG. 4, the input 2 is also connected to a 90° phase shifter 6 which is in turn connected to a phase comparator 4. The phase comparator 4 is also connected to one collector of the multi-collector transistor TR1 provided in the last I$^2$L Qn, which is substantially identical to the output 7. An output of the phase comparator 4 for producing a control signal representing a phase difference between the signals at the input 2 and output 7 is connected to a low pass filter 5 and further to the junction J1.

It is to be noted that a suitable buffer circuit (not shown) should preferably be connected between the low pass filter 5 and the junction J1. Also, instead of between the input 2 and the phase comparator 4, the 90° phase shifter 6 can be inserted between the output 7 and the phase comparator 4.

It is also to be noted that the transistor TR1 provided in each I$^2$L, except for the last I$^2$L, does not necessarily have to be a multi-collector type, but can be a single collector type, as shown in FIG. 4, so long as no signal is taken out from the transistor TR1 in any I$^2$L other than the last.

It is further to be noted that instead of an I$^2$L, other semiconductor elements can be employed so long as such a semiconductor element has a delay characteristic similar to that of an I$^2$L.

The control circuit as described above operates as follows. When a quantized combination signal, which is defined by a code signal having a predetermined pattern followed by an information signal carrying a required data with the code signal and information signal being repeated periodically, passes through the delay line 3, the quantized combination signal at the output 7 is delayed by a preselected time, such as one cycle, with respect to the quantized combination signal at the input 2.

If there is no undesirable delay change in the delay line 3, the code signal produced concurrently from the output 7 has the same phase as the phase of the subsequent code signal applied to the input 2. Thus, there will be no phase difference between the code signals at the output 7 and input 2. In this case, the code signals applied to the phase comparator 4 from the 90° phase shifter from the output 7 have phase difference of 90°. Therefore, when these two code signals applied to the phase comparator 4 are expressed with vector representation and are multiplied with each other, the resultant will be zero. Thus, the phase comparator 4 continues to produce a control signal without any change. Such a control signal is applied through the low pass filter 5 to the junction J1 as the injection current. Since there is no change in the injection current, there will be no change in the delay effected in the delay line 3, thereby maintaining the required delay time.

In contrast to the above, if there is an undesirable delay change in the delay line 3 such that the delay effected through the delay line 3 is greater than the required period, e.g., one cycle, the multiplication of code signals in vector representation in the phase comparator 4 will result in a scalar value in a plus or minus region determined by the parameters chosen in the phase comparator 4. It is now assumed that the parameters are so chosen to provide a plus scalar value as a result of the multiplication of the two code signals under the present condition. Accordingly, the phase comparator 4 produces a control signal with its level increased by an amount relative to the plus scalar value. This control signal is applied to the junction J1 as the injection current, thereby increasing the injection current relatively to the plus scalar value. Thus, as apparent from the graph of FIG. 2, the delay time is decreased so as to correct the undesirable delay change and to effect the delay as required.

In a manner similar to the above, if there is an undesirable delay change in the delay line 3 such that the delay is less than the required delay, the phase comparator 4 produces a minus scalar value. Thus, the injection current decreases relatively to the minus scalar value. Thus, the delay time is increased so as to correct the undesirable delay change and to effect the delay as required.

Figure 6:
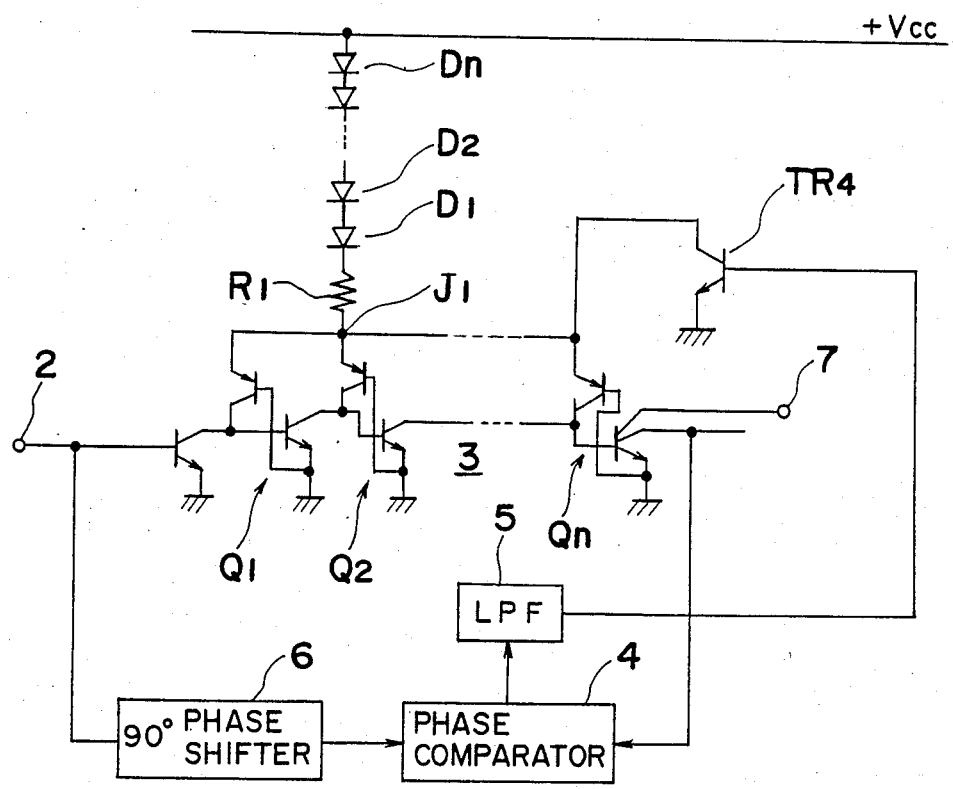
FIG. 6 is a circuit diagram of a delay circuit according to a second embodiment of the present invention.

Referring next to FIG. 6, a delay circuit according to the second embodiment of the present invention is shown. When compared with the delay circuit of the first embodiment, the delay circuit of the second embodiment further has a series of diodes D1, D2, . . . and Dn and a resistor R1 connected in series between a constant power line +Vcc and the junction J1. The control signal from the phase comparator 4 is applied to the low pass filter 5 and in turn to the base of an emitter grounded transistor TR4. The collector of the transistor TR4 is connected to the junction J1.

Figure 7:
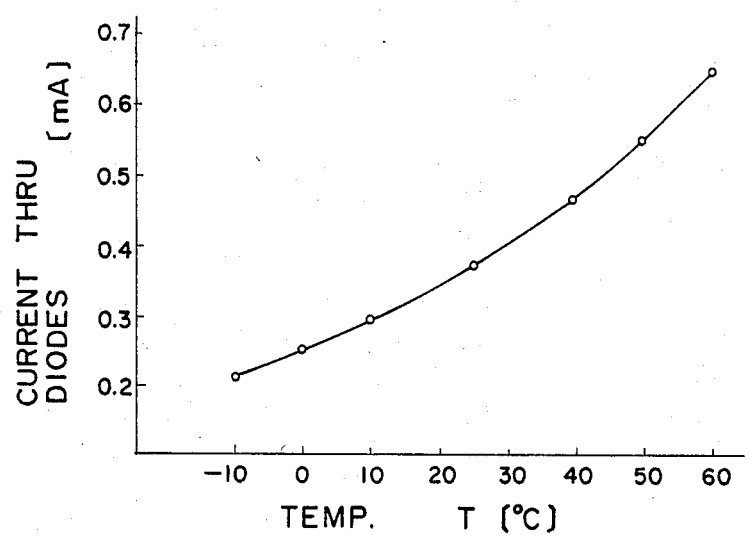
FIG. 7 is a graph showing a current characteristic of temperature compensation diodes in which abscissa and ordinate, respectively, represent temperature and current flowing through the diodes.

It is to be noted that the temperature characteristic of the diodes D1 to Dn when applied with a forward bias voltage, is in reverse relation to the temperature, i.e. the impedance decreases as the temperature increases. Therefore, the injection current will have a characteristic proportional to the temperature. More specifically, as the temperature rises, the forward voltage across the diodes D1 to Dn becomes small and, therefore, the injection current increases. Contrary, when the temperature decreases, the injection current decreases relatively thereto. This relation can be further understood from the graph shown in FIG. 7 in which abscissa and ordinate represent temperature and current flowing through the diodes D1 to Dn. The curve shown in FIG. 7 is obtained under a condition such that the resistor R1 has 2.7 kilohms and the voltage Vcc is equal to 9 volts.

Figure 5:
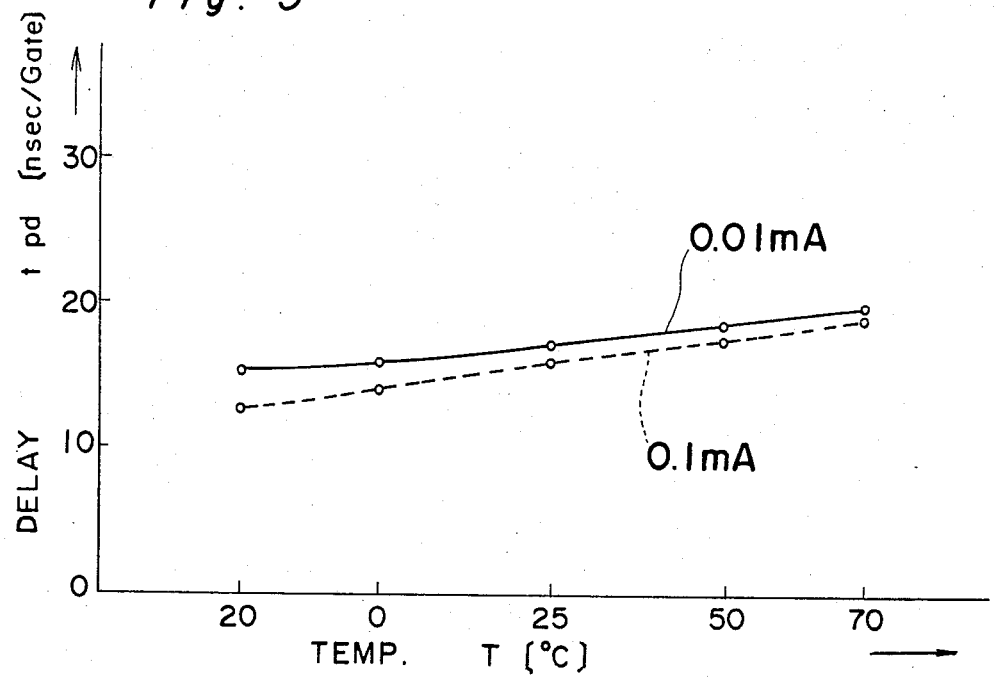
FIG. 5 is a graph showing a delay change characteristic relatively to the temperature in which abscissa and ordinate represent temperature and delay time, respectively.

Therefore, when the temperature rises, the delay period in each I²L increases, as shown by the graph of FIG. 5. But, by the employment of the diodes D1 to Dn, the increase in temperature causes an increase of the injection current, as shown by the graph of FIG. 7. And, as shown by the graph of FIG. 2, the increase of injection current results in a decrease of the delay period. Accordingly, by the employment of the diodes D1 to Dn, the undesirable increase of the delay period in each I²L caused by the temperature increase can be counterbalanced or compensated so that the delay period can be maintained constant or almost constant to the desired delay period regardless of temperature change. Therefore, the temperature characteristic curve of the I²L, such as shown in FIG. 5, can be more flattened. Because of the above operation, the diodes D1 to Dn are referred to as temperature-compensating diodes. It is needless to say that the undesirable change in the delay period, whether it is caused by the temperature change or by any other factor, can also be corrected by the control signal produced from the phase comparator 4 in a manner described above.

Next, the number of temperature-compensating diodes to be employed is discussed.

When the injection current is set equal to 0.1 mA and if the temperature changes from −20° C. to 70° C., the change in delay period in each I²L will be about 6 nanoseconds, as understood from the dotted line shown in FIG. 5. In order to compensate the delay change of 6 nanoseconds, it is understood from the graph of FIG. 2 that the injection current must be changed from 0.075 to 0.145 mA/Gate. If there are five I²Ls connected in cascade in the delay line 3, the total injection current applied to the junction J1 under the temperature −20° C. will be 0.375 mA, and the same under the temperature 70° C. will be 0.725 mA.

Since the relationship between the injection current Ij and the resistance r1 of the resistor R1 can be given as:

$$\frac{Vcc - (x + 1)[Vf - dVf(T - 25)]}{r1} = Ij,$$

wherein Vf is the forward bias voltage, dVf is the amount of change of the forward bias voltage Vf, x is the number of temperature-compensating diodes, +1 to the x is for one PN junction of emitter and base of the second transistor of the I²L, and T is the temperature, a specific number of diodes x can be obtained when specific numbers for the other parameters are given.

For example, if Vf is 0.7 volts under 25° C., and dVf is equal to −0.0016 V/° C., it can be calculated using above equation that:

r1=3.89 kilohms and x=8.77.

For this case, it is necessary to provide nine temperature-compensating diodes D1 to D9.

Figure 8:
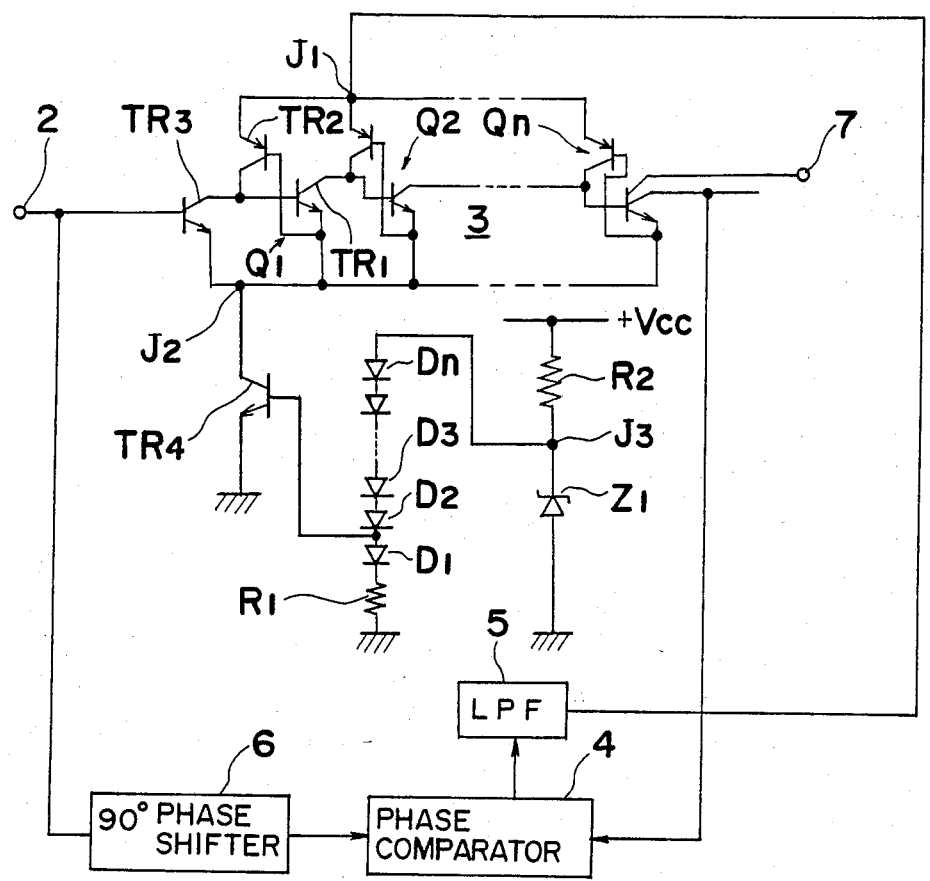
FIG. 8 is a circuit diagram of a delay circuit according to a third embodiment of the present invention.

Referring next to FIG. 8, a delay circuit according to the third embodiment of the present invention is shown. According to the delay circuit of the second embodiment of FIG. 6, the series of diodes D1, D2, . . . and Dn and the resistor R1 are so connected as to directly control the injection current fed to the emitter of transistor TR2 in each I²L. Whereas according to the delay circuit of the third embodiment of FIG. 8, a series of diodes D1, D2, . . . and Dn and resister R1 are so connected as to control the injection current by the control of emitter current of transistor TR1 in each I²L. More specifically, the emitter of each transistor TR1 in the delay line 3 and the emitter of the transistor TR3 are connected to a common junction J2 which is further connected to a collector of an emitter grounded transistor TR4. The base of the transistor TR4 is connected to the series connection of diodes D1 to Dn, such as between the diodes D1 and D2, as shown. A series connection of resistor R2 and zener diode Z1 is connected between the constant voltage source +Vcc and ground, thereby producing a required stable constant voltage at a junction J3 between the resistor R2 and zener diode Z1. The series of diodes D1 to Dn and resistor R1 is connected between the junction J3 and ground.

Furthermore, the delay circuit of FIG. 8 has the output of the low pass filter 5 connected to the junction J1, as in the first embodiment.

In operation, when the temperature increases, the delay period in the delay line 3 increases (FIG. 5). But on the other hand, by the increase of the temperature, the current through the diodes D1 to Dn increases (FIG. 7), resulting in increase of the biasing voltage to the base of the transistor TR4. Thus, the conductivity of the transistor TR4 is increased, making more current to flow through emitter of transistor TR1 in each I²L, resulting in an increase of the injection current. As a consequence, the delay period is decreased (FIG. 2), thereby counterbalancing the increase of the delay period as occurred directly by the temperature increase. By all means, as in the second embodiment, the correction of the delay period is done not only by the temperature-compensating diodes, but also by the control signal produced from the phase comparator 4.

Figure 9:
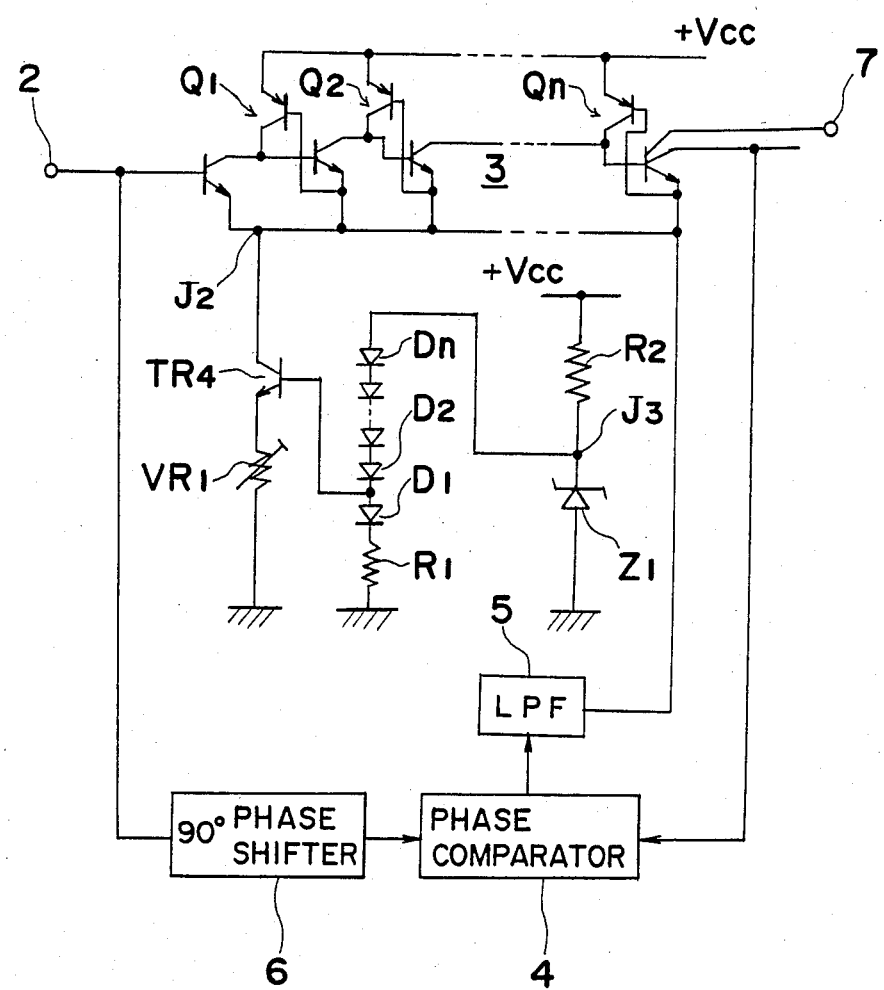
FIG. 9 is a circuit diagram of a delay circuit according to a fourth embodiment of the present invention.

Referring next to FIG. 9, a delay circuit according to the fourth embodiment of the present invention is shown. When compared with the third embodiment, the fourth embodiment has the output of the low pass filter 5 connected to the common junction J2. As apparent to those skilled in the art, the control signal produced from the low pass filter 5 will control the injection current in a similar manner described above for the first embodiment.

Moreover, when compared with the third embodiment, the delay circuit of fourth embodiment further has a variable resistor VR1 between the emitter of the transistor TR4 and ground. Accordingly, the injection current can be changed, making it possible to manually set the required delay period.

The phase comparator 4 has a certain limit for correcting the undesirable delay change, and when the delay change exceeds the limit, the comparator 4 may not be able to correct the delay change properly. But according to the embodiments described above in connection with FIGS. 6, 8 and 9, such a delay change is partly corrected by diodes D1, D2, . . . and Dn, and resistor R1, and therefore, the delay change can be corrected accurately with a high reliance.

Figure 10:
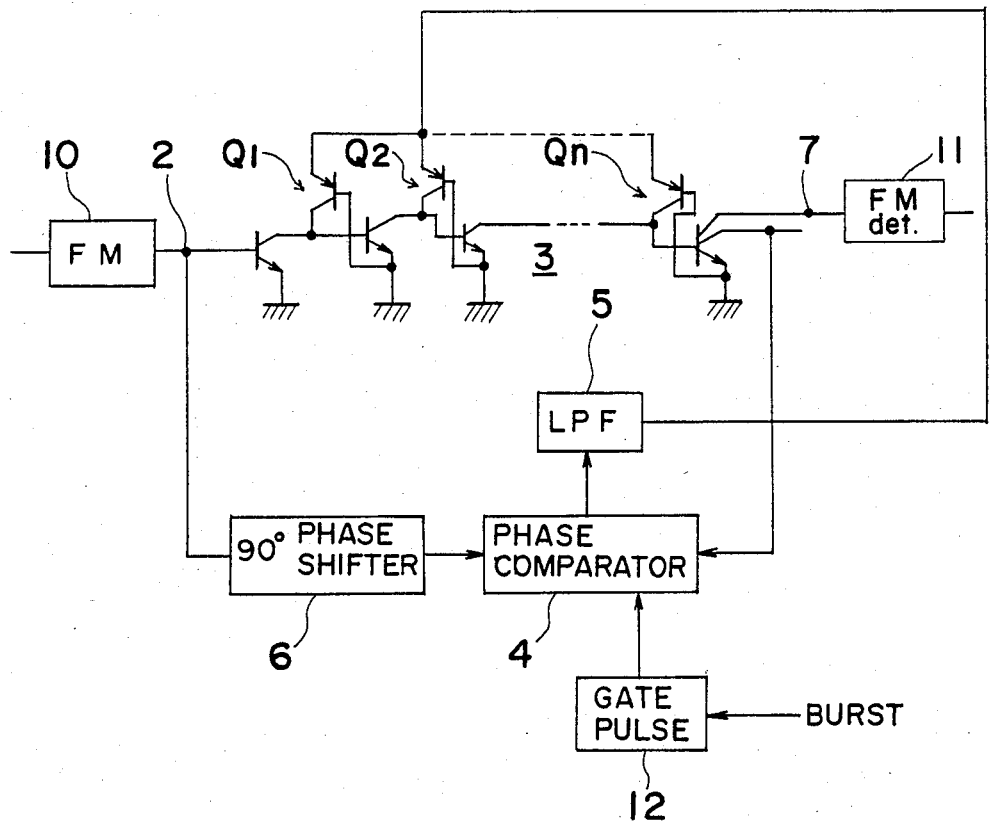
FIG. 10 is a circuit diagram of a delay circuit of the present invention employed in an 1H delay line for delaying video signal in a PAL system.

Referring now to FIG. 10, a block diagram is shown wherein the delay circuit of the first embodiment is employed in the 1H delay line of a PAL video signal circuit. Since 1H period is about 64 microseconds, there will be 640 I²Ls needed to effect the 1H delay, provided that each I²L has a delay effect of 0.1 microseconds.

As apparent to those skilled in the art, the PAL video signal comprises burst signal having a predetermined pattern followed by color signal carrying color data, and the burst signal and color signal are repeated periodically with a cycle of 1H. Since the PAL video signal is not quantized with logic "1" and "0", it is quantized by way of frequency modulation. Thus, a frequency modulator 10 is connected to the input 2 of the delay line 3. The phase comparator 4 is connected to a gate pulse generator 12 which receives a burst signal and produces a pulse when the burst signal is present. The phase comparator 4 is actuated only when the pulse from the gate pulse generator 12 is present. Thus, the phase comparator 4 compares the phase between the real time burst signal applied from the input 2 through the 90° phase shifter and the 1H delayed burst signal from the output 7, and produces the control signal representing the phase difference therebetween. The control signal is fed back to the delay line 3 for controlling the injection current in the manner described above. Thus, the delay in the delay line 3 is controlled to be substantially equal to 1H period.

The signal produced from the output 7 is demodulated by a frequency demodulator 11, and the demodulated signal is applied to a known color demodulator (not shown) of the PAL system.

It is to be noted that the delay circuit of other embodiments can be used for the 1H delay line of a PAL video signal circuit.

Figure 11:
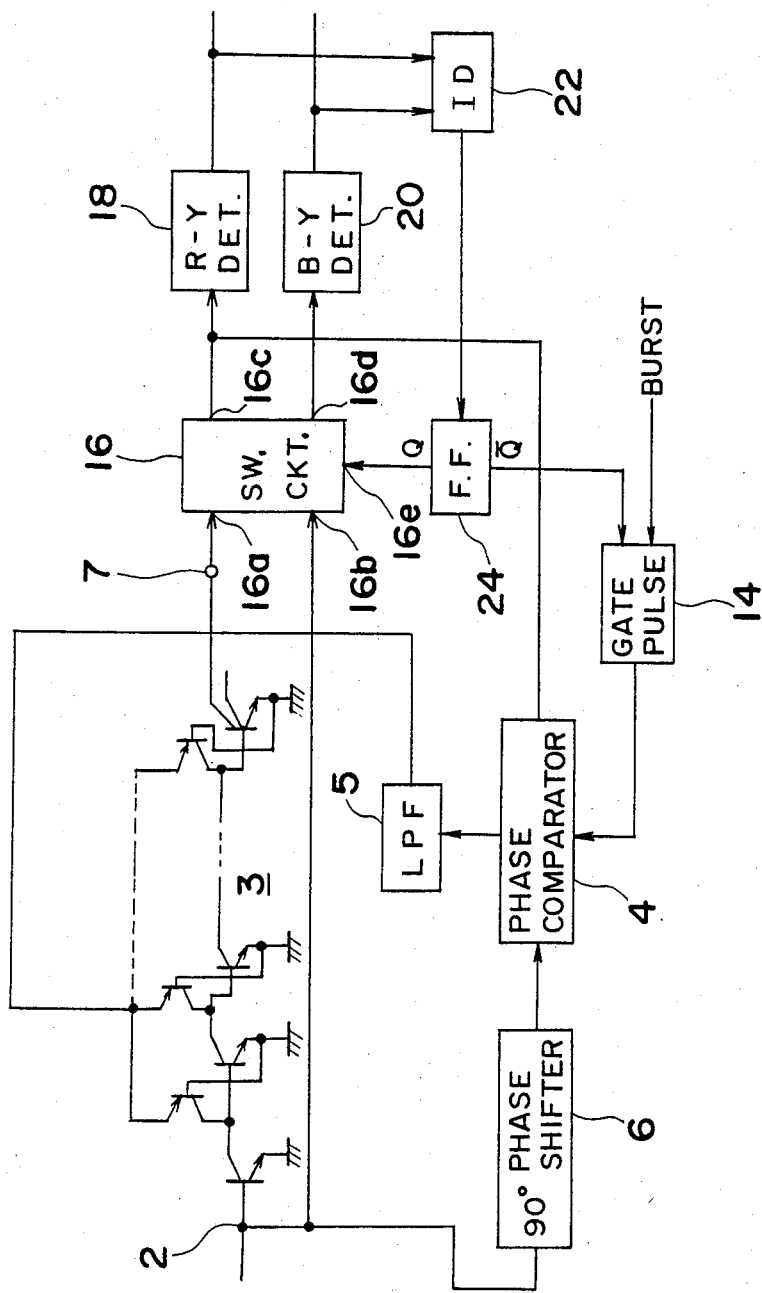
FIG. 11 is a circuit diagram of a delay circuit of the present invention employed in an 1H delay line for delaying video signal in a SECAM system.

Referring to FIG. 11, a block diagram is shown wherein the delay circuit of the first embodiment is employed in the 1H delay line of a SECAM video signal circuit. As apparent to those skilled in the art, the SECAM video signal comprises R-Y signals and B-Y signals which are repeated alternately with each of the R-Y and B-Y signals having 1H period duration. The R-Y signal includes a burst signal having a predetermined frequency f1 followed by an FM color signal containing R-Y color data carried on a first carrier signal of frequency f1. Similarly, the B-Y signal includes a burst signal having a predetermined frequency f2 followed by an FM color signal containing B-Y color data carried on a second carrier signal of frequency f2. Since the SECAM video signal is already quantized with logic "1" and "0" by way of frequency modulation, it is not necessary to provide any quantizing device, such as a frequency modulator.

A switching circuit 16 has two inputs 16a and 16b, two outputs 16c and 16d, and a mode selecting terminal 16e. The input 16a is connected to the output 7 of the delay line 3 and the input 16b is connected to the input 2 of the delay line 3. The output 16c is connected to an R-Y detector 18 for producing a R-Y signal and the output 16d is connected to a B-Y detector 20 for producing a B-Y signal. The output 16c is also connected to the phase comparator 4. The R-Y detector 18 and B-Y detector 20 are both connected to an identifying circuit 22 which produces HIGH or LOW signal to a flip-flop 24. The Q output of the flip-flop 24 is connected to the switching circuit 16 at the mode selecting terminal 16e and the $\overline{Q}$ output of the same is connected to a gate pulse generator 14 which also receives a burst signal. The flip-flop 24 changes its output state between HIGH and LOW alternately with each HIGH and LOW having a duration of 1H. When the flip-flop 24 is producing HIGH from its Q output, the switching circuit 16 operates such that the input 16a is connected to the output 16c and the input 16b is connected to the output 16d. Conversely, when the flip-flop 24 is producing LOW from its output Q, the switching circuit 16 operates such that the input 16a is connected to the output 16d and the input 16b is connected to the output 16c.

In operation under a certain 1H period, it is assumed that the input 16a is receiving 1H delayed R-Y signal fromthe output 7, the other input 16b is receiving real time B-Y signal from the input 2. During this period, the flip-flop 24 produces HIGH from its Q output so that the 1H delayed R-Y signal at the input 16a is transferred to the output 16c and further to the R-Y detector 18 and, at the same time, the real time B-Y signal at the input 16b is transferred to the output 16d and further to the B-Y detector 20. Furthermore during this period, since the $\overline{Q}$ output of the flip-flop 24 is producing LOW, the gate pulse generator 14 is disabled and, therefore, it produces no pulse within this 1H period. Thus, the phase comparator 4 is maintained disabled to produce no control signal during this 1H period.

Then, in the next 1H period, the input 16a receives 1H delayed B-Y signal from the output 7 and the other input 16b receives real time R-Y signal from the input 2. Since the Q output from the flip-flop 24 is now producing LOW, the 1H delayed B-Y signal at the input 16a is transferred to the output 16d and further to the B-Y detector 20 and, at the same time, the real time R-Y signal at the input 16b is transferred to the output 16c and further to the R-Y detector 18. Furthermore during this period, since the $\overline{Q}$ output of the flip-flop 24 is producing HIGH, the gate pulse generator 14 is so actuated as to produce a pulse when the burst signal is present during this 1H period. Thus, upon receipt of the gate pulse from the gate pulse generator 14, the phase comparator 4 compares the phase of the burst signal in the real time R-Y signal from the input 2 and R-Y signal at the output 16c, thereby producing a control signal for controlling the injection current in a manner described above.

It is to be noted that the delay circuit of other embodiments can be used for the 1H delay line of a SECAM video signal circuit.

It is also to be noted that the delay circuit according to the present invention can be used for delaying other signals, such as a character signal, carried in, e.g., 21st H line signal, as shown in FIG. 12(a), and/or in other H line signal, as shown in FIGS. 12(a) and 12(b), in a multiplex communication system. In this case, the character signal can be delayed by a required amount by changing the injection current, for example by changing the resistance of the variable resistor VR1 (FIG. 9).

More specifically, the character signal (for alphanumeric character or for symbol character) is located, as shown in FIG. 12(c), after the horizontal sync pulse HS and constant signal CG, and is defined by clock-run-in signal CRI, framing-code signal FRC and data signal DA. Since the clock-run-in signal CRI is used for generating a pulse for reading the character signal in the television receiver, it is necessary to match the phase of the reading pulse and the character signal. For this purpose, by adjusting the phase of either the reading pulse or character signal by way of variable resistor VR1 (FIG. 9), it is possible to match the phase of these two signals. When matching the phase of these two signals using the delay line 3, the delay period in each $I^2L$ may be undesirably changed, but can be corrected when the delay circuit according to the present invention is employed.

As has been described above, the delay circuit according to the present invention is formed by $I^2L$s and, therefore, can readily be formed in an IC chip. Thus, the space factor can be improved, resulting in a compact size delay circuit and low manufacturing cost.

Furthermore, since the control signal obtained by using the delayed signal is fed back to the delay circuit, the undesirable change in the delay period can be corrected with a high accuracy.

Moreover, since the temperature-compensating diodes are employed, the undesirable delay change caused by the temperature change can be minimized.

Moreover, the delay circuit according to the present invention operates with a relatively small amount of electric power.

Although the present invention has been fully described with reference to several preferred embodiments, many modifications and variations thereof will now be apparent to those skilled in the art, and the scope of the present invention is therefore to be limited not by the details of the preferred embodiments described above, but only by the terms of appended claims.

What is claimed is:

1. A delay circuit for delaying a quantized conbination signal comprising:

an input means for supplying an input quantized combination signal;

an output means for producing a delayed quantized combination signal;

a delay line connected between said input means and said output means for delaying said quantized combination signal, said delay line including at least one semiconductor integrated injection logic ($I^2L$) circuit which operates to delay a signal applied to said input means by an amount determined by an injection current applied thereto, said $I^2L$ circuit comprising a first transistor and a second transistor connected so that a base of said first transistor, which base serves as an input terminal connected to said input means, is connected to a collector of said second transistor, a grounded emitter of said first transistor is connected to a base of said transistor, an emitter of said second transistor is connected to receive said injection current and a collector of said first transistor serves as an output terminal connected to said output means;

phase comparator means connected between said input means and said output means for making a phase comparison between said input signal and said output signal and for producing a difference signal representing phase difference between said signal, said difference signal being connected to said $I^2L$ circuit to control the injection current applied thereto to maintain a constant phase difference between said delayed and input signals to provide a desired delay in said delayed signal; and a temperature compensating circuit comprising at least one temperature compensating diode connected in series with a resistor, said temperature compensating circuit being connected to a source of potential and to said $I^2L$ circuit so as to control said injection current to compensate for variations in delay of said delay line means due to effects of temperature change.

2. A delay circuit as recited in claim 1, wherein said temperature compensating circuit comprises a transistor connected in series with said $I^2L$ circuit and a source of potential and at least one temperature compensating diode connected in series with a resistor to a constant voltage source, said diode being connected to said transistor to control current therethrough to increase proportional to temperature.

3. A delay circuit as claimed in claim 1, wherein said phase comparator means includes a 90° phase shift means for shifting either one of said input and delayed quantized combination signals and for producing a phase shift signal, and a multiplier for multiplying said phase shift signal with another one of said input and delayed quantized combination signals in vector representation and for producing a scaler product representing phase difference between said input and delayed signals.

4. A delay circuit as claimed in claim 1, wherein said phase comparator means comprises a 90° phase shifter and a phase comparator.

5. A delay circuit as claimed in claim 1, wherein said difference signal is applied to said emitter of said second transistor as injection current.

6. A delay circuit as claimed in claim 1, further comprising a constant voltage source and at least one temperature-compensating diode for compensating delay changes in said delay line means caused by temperature change, said temperature-compensating diode connected between said constant voltage source and said emitter of said second transistor.

7. A delay circuit as claimed in claim 1, further comprising a third transistor connected between said emitter of said first transistor and ground, a constant voltage source, and at least one temperature-compensating diode for compensating for delay changes in said delay line means caused by temperature change, said temperature-compensating diode being connected between said constant voltage source and a base of said third transistor.

8. A delay circuit as claimed in claim 7, further comprising a variable resistor connected between said third transistor and ground for changing said injection current.

* * * * *

UNITED STATES PATENT AND TRADEMARK OFFICE
CERTIFICATE OF CORRECTION

PATENT NO. :   4,652,778
DATED      :   March 24, 1987
INVENTOR(S) :  NOBUKAZU HOSOYA ET AL It is certified that error appears in the above-identified patent and that said Letters Patent is hereby corrected as shown below:

On the cover page, Item [54], before "DELAY" delete "$I^2L$".

Signed and Sealed this

Eleventh Day of August, 1987

*Attest:*

DONALD J. QUIGG

*Attesting Officer*                    *Commissioner of Patents and Trademarks*